US009985209B2

(12) United States Patent
Ishii

(10) Patent No.: US 9,985,209 B2
(45) Date of Patent: May 29, 2018

(54) METHOD FOR TESTING LIFETIME CHARACTERISTICS OF DISPLAY PANEL, AND METHOD FOR MANUFACTURING DISPLAY PANEL

(71) Applicant: JOLED INC., Tokyo (JP)

(72) Inventor: Hidekazu Ishii, Tokyo (JP)

(73) Assignee: JOLED INC., Tokyo (JP)

( * ) Notice: Subject to any disclaimer, the term of this patent is extended or adjusted under 35 U.S.C. 154(b) by 0 days. days.

(21) Appl. No.: 15/125,741

(22) PCT Filed: Dec. 24, 2014

(86) PCT No.: PCT/JP2014/006432
§ 371 (c)(1),
(2) Date: Sep. 13, 2016

(87) PCT Pub. No.: WO2015/140864
PCT Pub. Date: Sep. 24, 2015

(65) Prior Publication Data
US 2017/0005268 A1 Jan. 5, 2017

(30) Foreign Application Priority Data
Mar. 17, 2014 (JP) ................................ 2014-053701

(51) Int. Cl.
*H01L 51/00* (2006.01)
*H05B 33/10* (2006.01)
(Continued)

(52) U.S. Cl.
CPC ......... *H01L 51/0031* (2013.01); *G09G 3/006* (2013.01); *G09G 3/3233* (2013.01);
(Continued)

(58) Field of Classification Search
CPC . H01L 51/5253; H01L 51/56; H01L 51/5246; H01L 2251/5338; H01L 51/0097
See application file for complete search history.

(56) References Cited

U.S. PATENT DOCUMENTS 8,599,223 B2   12/2013  Hasegawa et al.
2007/0298279 A1  12/2007  Uchida
(Continued)

FOREIGN PATENT DOCUMENTS

JP   2005-062720   3/2005
JP   2007-121990   5/2007
(Continued)

OTHER PUBLICATIONS

International Search Report (ISR) in International Pat. Appl. No. PCT/JP2014/006432, dated Mar. 17, 2015.

*Primary Examiner* — Tony Tran
(74) *Attorney, Agent, or Firm* — Greenblum & Bernstein, P.L.C.

(57) ABSTRACT

A method for testing lifetime characteristics of a display panel in which a plurality of pixels each including a light-emitting element (an organic EL element) are arranged in a matrix, includes: setting a first light-emitting region including a plurality of pixels; setting a non-light-emitting region including all pixels adjacent to the first light-emitting region; setting a second light-emitting region including pixels which are not included in the first light-emitting region and the non-light-emitting region; and testing the lifetime characteristics of the display panel by causing the pixels in the first light-emitting region and the pixels in the second light-emitting region to emit light at different luminance levels without causing the pixels in the non-light-emitting region to emit light.

4 Claims, 6 Drawing Sheets

(51) Int. Cl.
    *H05B 33/12*     (2006.01)
    *G09G 3/00*     (2006.01)
    *G09G 3/3233*     (2016.01)
    *H01L 21/66*     (2006.01)
    *H01L 51/56*     (2006.01)

(52) U.S. Cl.
    CPC .............. *H01L 22/20* (2013.01); *H01L 51/56* (2013.01); *H05B 33/10* (2013.01); *H05B 33/12* (2013.01)

(56) References Cited

U.S. PATENT DOCUMENTS

2011/0037786 A1    2/2011    Hasegawa et al.
2012/0007137 A1*  1/2012    Lee .................... H01L 51/5246
                                                                257/100

FOREIGN PATENT DOCUMENTS

| JP | 2011-039311 | 2/2011 |
| JP | 2011-203314 | 10/2011 |
| JP | 2012-169159 | 9/2012 |
| JP | 2012-174712 | 9/2012 |
| WO | 2005/122702 | 12/2005 |

\* cited by examiner

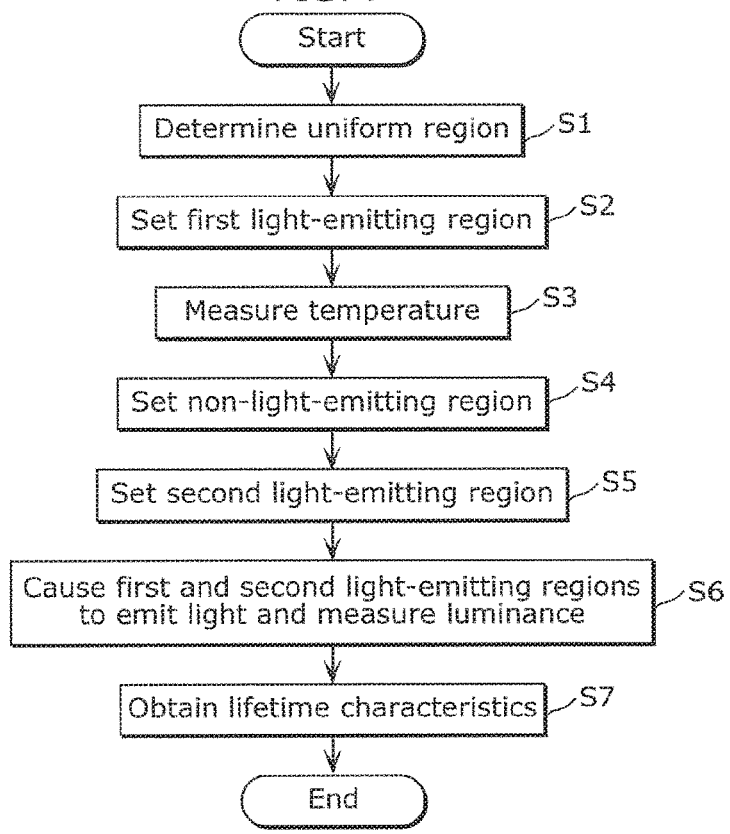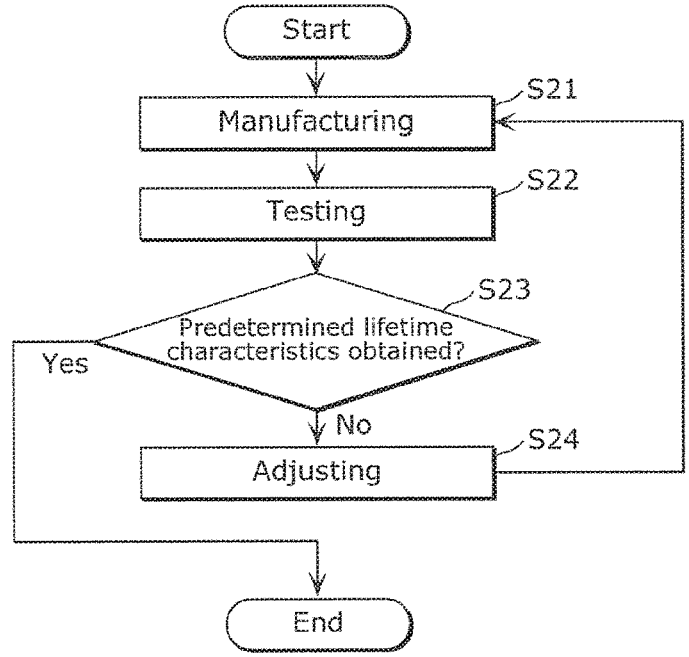

METHOD FOR TESTING LIFETIME CHARACTERISTICS OF DISPLAY PANEL, AND METHOD FOR MANUFACTURING DISPLAY PANEL

TECHNICAL FIELD

The present disclosure relates to a method for testing lifetime characteristics of a display panel and a method for manufacturing the display panel.

BACKGROUND ART

Patent Literature (PTL) 1 discloses a method for testing lifetime characteristics of organic electroluminescent (EL) elements used in an organic EL display device. In the testing method, the photoluminescence intensities of organic EL elements are detected at two or more different temperatures, and the lifetime characteristics of the organic EL elements are tested based on the ratio of the intensities. According to the above testing method, it is possible to test the lifetime characteristics of the organic EL elements without performing an aging test.

CITATION LIST

Patent Literature

[PTL 1] International Publication No. WO2005/122702

SUMMARY OF INVENTION

Technical Problem

The present disclosure provides a method for accurately testing the lifetime characteristics of a display panel in a display device.

Solution to Problem

The method for testing the lifetime characteristics of the display panel according to the present disclosure is a method for testing lifetime characteristics of a display panel in which a plurality of pixels each including a light-emitting element are arranged in a matrix. The method includes: setting a first light-emitting region including pixels among the plurality of pixels; setting a non-light-emitting region including all pixels adjacent to the first light-emitting region among the plurality of pixels; setting a second light-emitting region including pixels, among the plurality of pixels, which are not included in the first light-emitting region and the non-light-emitting region; and testing the lifetime characteristics of the display panel by causing the pixels in the first light-emitting region and the pixels in the second light-emitting region to emit light at different luminance levels without causing the pixels in the non-light-emitting region to emit light.

Advantageous Effects of Invention

The method for testing the lifetime characteristics of the display panel according to the present disclosure is effective for accurately testing the lifetime characteristics of the display panel.

BRIEF DESCRIPTION OF DRAWINGS

FIG. 7 is a flow chart of a procedure of the testing method according to Embodiment 1.

FIG. 8 is a flowchart of a procedure of a manufacturing method according to Embodiment 2.

DESCRIPTION OF EMBODIMENTS (Underlying Knowledge Forming Basis of the Present Disclosure)

The testing method disclosed in PTL 1 is effective when a simple test for the lifetime characteristics of an organic EL element alone is performed in a short period of time. However, an aging test is suitable for accurately testing the lifetime characteristics of the entire display panel in which pixels including organic EL elements are arranged in a matrix.

A method for testing the lifetime characteristics of the display panel through the aging test will be described.

First, matters that should be noted in the lifetime characteristics test will be described.

The lifetime of each pixel including an organic EL element depends on the luminance level at which the pixel emits light. Hence, in order to test the luminance dependency of the lifetime characteristics of the display panel, it is necessary to test the lifetime characteristics at different luminance levels.

Furthermore, in order to accurately obtain the lifetime characteristics, a plurality of pixels are caused to emit light and an average value of the lifetime characteristics of the pixels is obtained.

Furthermore, when testing the lifetime characteristics of the display panel, the light conversion efficiency can also be measured from the luminance level and the drive current value of a pixel. However, the value of the drive current flowing through each pixel is very small. Hence, in order to accurately measure the light conversion efficiency, an average value of the drive current values needs to be obtained by supplying a drive current to a plurality of pixels and measuring the sum of the driving current values.

In view of the above matter, in the test of the lifetime characteristics, a plurality of light-emitting regions each including a plurality of pixels are set, and the lifetime characteristics of the light-emitting regions are obtained by causing the pixels in the light-emitting regions to emit light.

Next, a method for setting a plurality of light-emitting regions in a display panel will be described with reference to FIG. 9 and FIG. 10.

Figure 9:
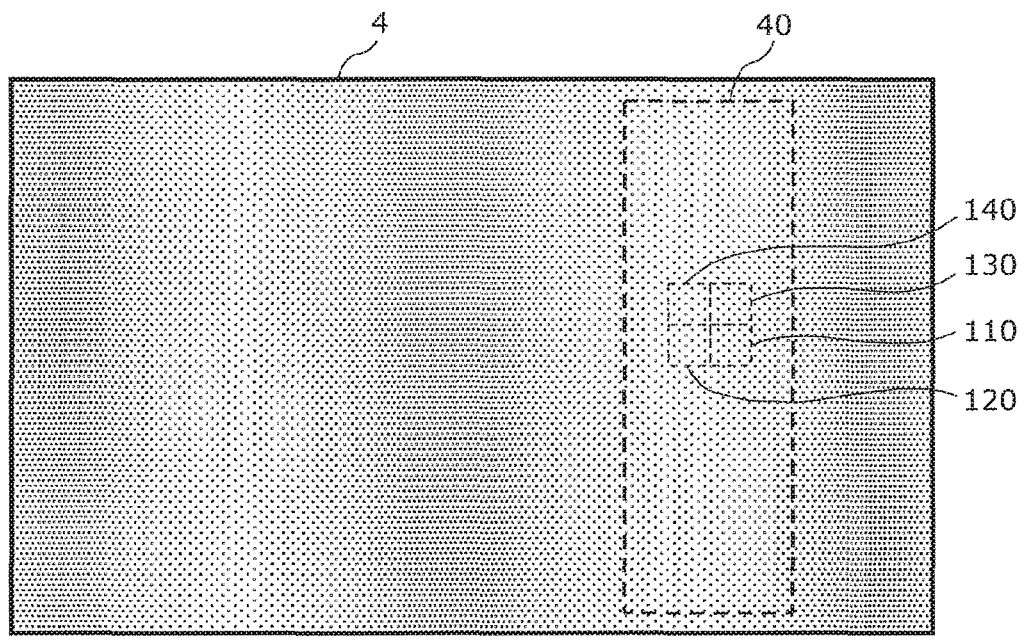
FIG. 9 schematically illustrates luminance distribution when the same level of power is supplied to all the pixels in a display panel to cause the pixels to emit light and an arrangement of light-emitting regions.

FIG. 9 schematically illustrates luminance distribution when the same level of power is supplied to all the pixels in a display panel to be tested to cause the pixels to emit light and an arrangement of light-emitting regions.

Figure 10:
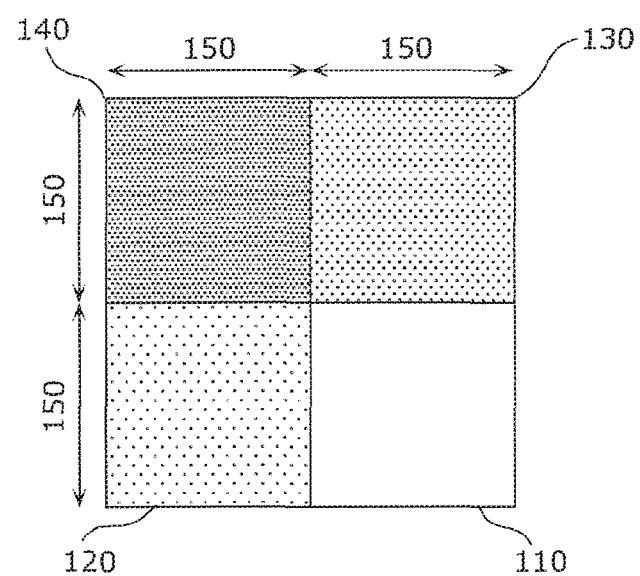
FIG. 10 is an enlarged view of the light-emitting regions in the display panel.

FIG. 10 is an enlarged view of the light-emitting regions in the display panel.

As illustrated in FIG. 9, even if the same level of power is supplied to all the pixels in the display panel 4, the luminance levels of the pixels are generally not the same. Such variations in luminance level are caused due to, for example, variations in characteristics of the organic EL elements in the pixels, or variations in characteristics of the drive circuits in the organic EL elements.

Therefore, when the lifetime characteristics of the display panel 4 are to be tested by setting a plurality of light-emitting regions in the display panel 4, the light-emitting regions need to be set within a region including pixels each having a luminance level within a predetermined range, in order to reduce variations in characteristics of the pixels in the light-emitting regions, as illustrated in FIG. 9. In the example illustrated in FIG. 9, a first light-emitting region 110, a second light-emitting region 120, a third light-emitting region 130, and a fourth light-emitting region 140 are set to be adjacent to each other within a uniform region 40 where each pixel has a luminance level within a predetermined range. In the example illustrated in FIG. 9, each light-emitting region is a square region vertically including 150 pixels and horizontally including 150 pixels. When testing the lifetime characteristics, the pixels in the respective light-emitting regions are continuously caused to emit light at different luminance levels, and, for example, time taken for the luminance level to decrease to half is measured.

In the testing method described above, the inventor has found out that there is a factor for a decrease in accuracy of the test. In the testing method described above, since the light-emitting regions are adjacent to each other, the lifetime characteristics of each light-emitting region are influenced by heat generated in adjacent light-emitting regions. For example, the lifetime characteristics of a light-emitting region are different between the case where the light-emitting region is adjacent to a light-emitting region which emits light at a high luminance level and the case where the light-emitting region is adjacent to a light-emitting region which emits light at a low luminance level. Therefore, depending on the testing methods, the lifetime characteristics of the light-emitting regions cannot be accurately measured because the lifetime characteristics of a light-emitting region is influenced by heat generated in an adjacent light-emitting region.

The present disclosure has been conceived based on such an underlying knowledge, to achieve a testing method which allows the lifetime characteristics of the display panel to be accurately tested.

Hereinafter, embodiments will be described in detail with reference to the drawings where necessary. Note, however, that detailed descriptions may be omitted where unnecessary. For example, detailed descriptions of well-known aspects or repetitive descriptions of essentially similar configurations may be omitted. This is to avoid redundancy and make the following description easier for those skilled in the art to understand.

Note that the inventor provides the accompanying drawings and the following description not to limit the scope of the claims, but to aid those skilled in the art to adequately understand the present disclosure.

Embodiment 1

Hereinafter, a testing method according to Embodiment 1 will be described with reference to the drawings.

1-1. Configuration of Test System

First, a test system for performing the testing method according to the present embodiment will be described.

Figure 1:
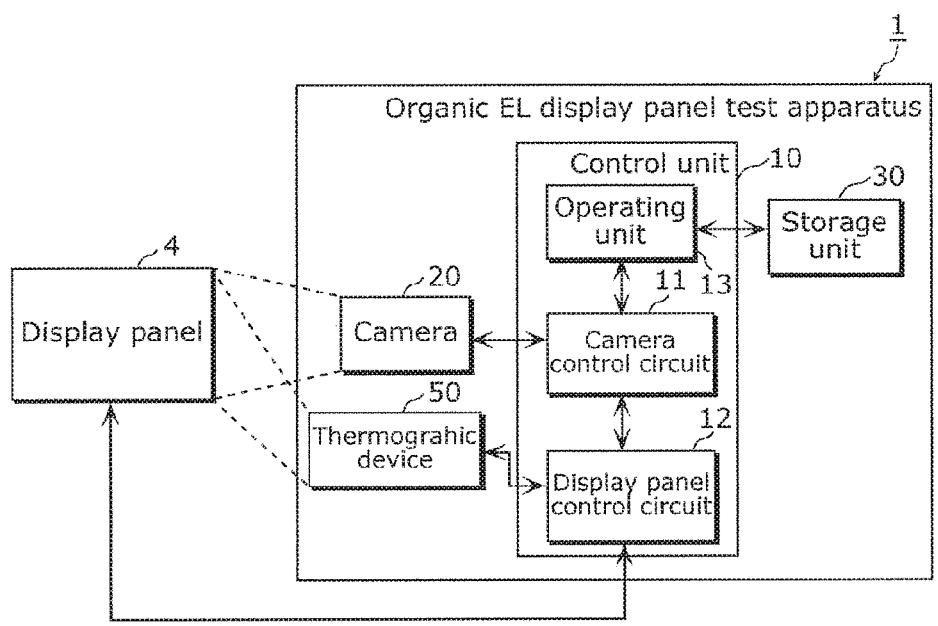
FIG. 1 is a block diagram illustrating an example of a configuration of a test system for performing a testing method according to Embodiment 1.

FIG. 1 is a block diagram illustrating an example of a configuration of a test system for performing the testing method according to the present embodiment. As illustrated in FIG. 1, the test system includes a display panel 4 to be tested, and an organic EL display panel test apparatus 1. The organic EL display panel test apparatus 1 is an apparatus which tests the luminance level and the temperature of each pixel arranged in a matrix in the display panel 4. The test apparatus 1 includes a control unit 10, a camera 20, a storage unit 30, and a thermographic device 50. The control unit 10 includes a camera control circuit 11, a display panel control circuit 12 and an operating unit 13.

The camera 20 is, for example, a charge coupled device (CCD) camera, and is an imaging device which images the display panel 4. The camera 20 includes an imaging region where a plurality of imaging elements are arranged in a matrix. The camera 20 includes: an imaging lens for collecting incident light on the plurality of imaging elements; and a shutter for determining passage and blockage of incident light to the imaging lens. With such configuration, light emitted from the pixels arranged in a matrix in the display panel 4 enters the imaging region of the camera 20 via the imaging lens. Each of the plurality of imaging elements converts incident light into the amount of charges corresponding to the quantity of the incident light. The positions of the display panel 4 and the camera 20 are adjusted such that the central axis of the display panel 4 coincides with the central axis of the imaging lens. Accordingly, for example, the imaging elements arranged at the central portion of the imaging region receive light emitted from the pixels arranged in the central portion of the display panel 4 and generate the amount of charges corresponding to the received light. The imaging elements arranged in the outer peripheral portion of the imaging region receive light emitted from the pixels arranged in the outer peripheral portion of the display panel 4, and generate the amount of charges corresponding to the received light.

The camera control circuit 11 is a camera control unit for opening and closing the shutter of the camera 20.

The thermographic device 50 is a temperature measuring part for measuring the temperature of each pixel in the display panel 4. The temperature information of each pixel measured by the thermographic device 50 is transmitted to the display panel control circuit 12, and is used for controlling light emission (on) and non-light emission (off) of each pixel in the display panel 4.

The display panel control circuit 12 is a display panel control unit for controlling on and off of the pixels in the display panel 4. The display panel control circuit 12 is controlled based on the temperature information of each pixel measured by the thermographic device 50 and luminance information of each pixel.

The operating unit 13 obtains the luminance levels of the target pixels of the luminance measurement from the image data obtained by the camera 20.

The storage unit 30 is a memory for storing the luminance data obtained by the operating unit 13. The storage unit 30 may be a memory built into the control unit 10.

1-2. Configuration of Display Panel

Here, a configuration of the display panel 4 to be tested by the testing method according to the present embodiment will be described.

Figure 2:
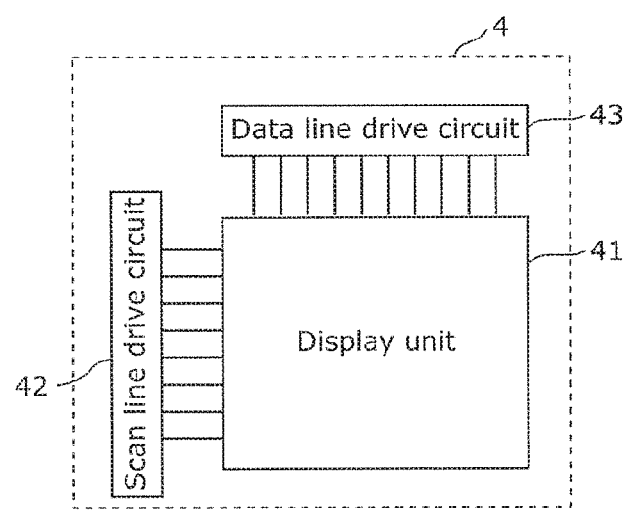
FIG. 2 is a block diagram illustrating a configuration of a display panel.

FIG. 2 is a block diagram illustrating a configuration of the display panel 4. As illustrated in FIG. 2, the display panel 4 includes a display unit 41, a scan line drive circuit 42, and a data line drive circuit 43.

The display unit 41 is a display region in which pixels including organic EL elements and drive elements for driving the organic EL elements are arranged in a matrix.

The scan line drive circuit 42 selects a pixel row to which a data voltage corresponding to gray level data is written, through the scan line arranged for each pixel row.

The data line drive circuit 43 outputs a data voltage to the pixels belonging to the selected pixel row via the data line arranged for each pixel column.

Figure 3:
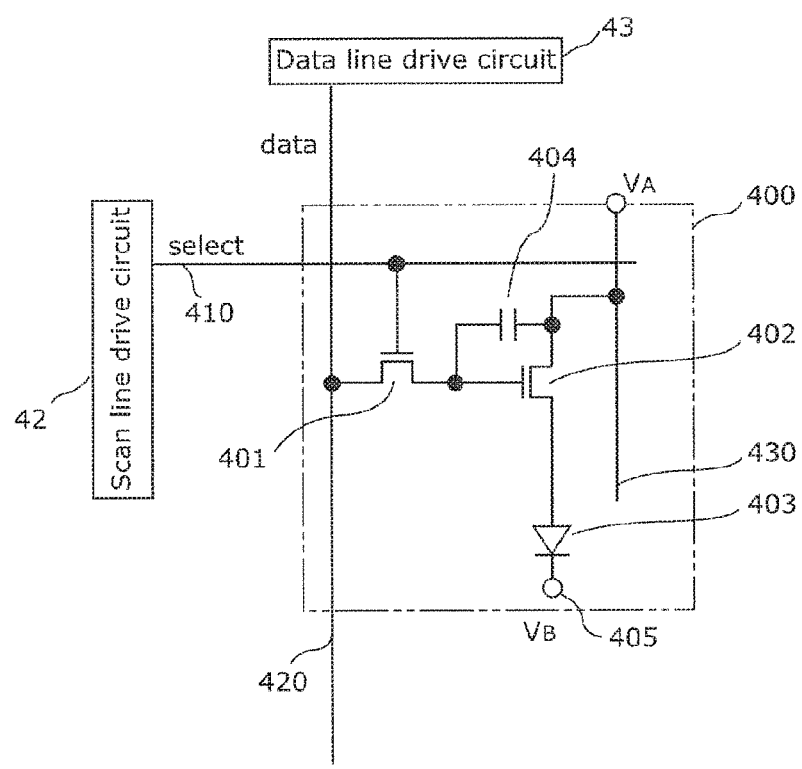
FIG. 3 is a diagram illustrating an example of a configuration of a pixel circuit and connections between the pixel circuit and its peripheral circuits.

FIG. 3 is a diagram illustrating an example of a configuration of a pixel circuit and connections between the pixel circuit and its peripheral circuits. A pixel 400 illustrated in FIG. 3 includes: a scan line 410; a data line 420; a power supply line 430; a selection transistor 401; a drive transistor 402; an organic EL element 403; a storage capacitor element 404; and a common electrode 405. The peripheral circuits include the scan line drive circuit 42 and the data line drive circuit 43.

The scan line drive circuit 42 is connected to the scan line 410, and has a function of controlling conduction and non-conduction of the selection transistor 401 of the pixel 400.

The data line drive circuit 43 is connected to the data line 420. The data line drive circuit 43 has a function of outputting a data voltage to determine a signal current flowing through the drive transistor 402.

The selection transistor 401 has a gate connected to the scan line 410, and has a function of controlling a timing at which the data voltage of the data line 420 is supplied to the gate of the drive transistor 402.

The drive transistor 402 functions as a drive element. The drive transistor 402 has a gate connected to the data line 420 via the selection transistor 401, a source connected to the anode of the organic EL element 403, and a drain connected to the power supply line 430. Accordingly, the drive transistor 402 converts the data signal supplied to the gate into a signal current corresponding to the data voltage, and supplies the converted signal current to the organic EL element 403.

The organic EL element 403 functions as a light-emitting element, and has a cathode connected to the common electrode 405.

The storage capacitor element 404 is connected between the power supply line 430 and the gate terminal of the drive transistor 402. The storage capacitor element 404, for example, has a function of maintaining the immediately prior gate voltage even after the selection transistor 401 is turned off, and continuously supplying a drive current from the drive transistor 402 to the organic EL element 403.

Although not illustrated in FIG. 3, the power supply line 430 is connected to a power supply (voltage $V_A$). The common electrode 405 is also connected to another power supply (voltage $V_B$).

The data voltage supplied from the data line drive circuit 43 is applied to the gate terminal of the drive transistor 402 via the selection transistor 401. The drive transistor 402 supplies a current corresponding to the data voltage between the source and drain terminals. When the current flows through the organic EL element 403, the organic EL element 403 emits light at the luminance level corresponding to the current.

When the display panel 4 is a panel for a color display, the pixel 400 is used as a sub-pixel. For example, three adjacent sub-pixels for respectively displaying Red, Green, and Blue are used as a set of pixels.

1-3. Method for Testing Display Panel

Next, a testing method according to the present embodiment will be described.

1-3-1. Light-Emitting Region Setting Method

A method for setting light-emitting regions used in the testing method according to the present embodiment will be described with reference to FIG. 4 and FIG. 5. Each light-emitting region includes pixels to be caused to emit light among the pixels in the display panel 4.

Figure 4:
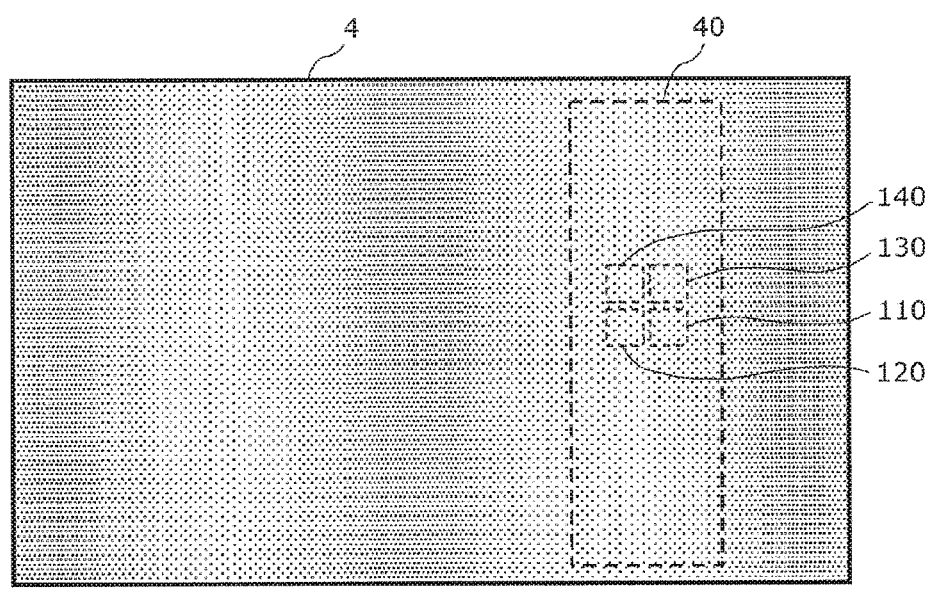
FIG. 4 schematically illustrates luminance distribution when the same level of power is supplied to all the pixels in the display panel to cause the pixels to emit light and an arrangement of light-emitting regions.

FIG. 4 schematically illustrates luminance distribution when the same level of power is supplied to all the pixels in the display panel to be tested by the testing method according to the present embodiment to cause the pixels to emit light and an arrangement of the light-emitting regions.

Figure 5:
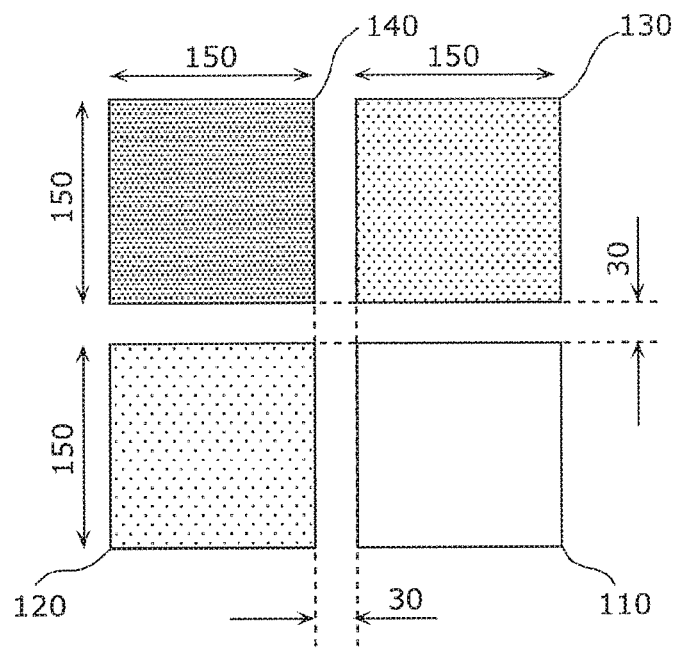
FIG. 5 is an enlarged view of the light-emitting regions in the display panel.

FIG. 5 is an enlarged view of light-emitting regions in the display panel 4.

As illustrated in FIG. 4, even if the same level of power is supplied to all the pixels in the display panel 4, the luminance levels of the pixels are not the same because of different characteristics of the pixels (see the matter which has been described related to FIG. 9). Accordingly, when the lifetime characteristics of the display panel 4 are to be tested by setting a plurality of light-emitting regions in the display panel 4, the light-emitting regions need to be set within a region including pixels each having a luminance level within a predetermined range, in order to uniform the characteristics of the pixels in the light-emitting regions. Here, although the range of the luminance levels of the pixels in the region in which the light-emitting regions are set is not particularly limited, for example, the range may be within ±5% of a predetermined luminance level.

In the example illustrated in FIG. 4, four light-emitting regions, which are a first light-emitting region 110, a second light-emitting region 120, a third light-emitting region 130, and a fourth light-emitting region 140, are set within a uniform region 40 which is a region including pixels each having a luminance level within a predetermined range. In the testing method according to the present embodiment, each of the light-emitting regions is a square region vertically including 150 pixels and horizontally including 150 pixels.

Here, in the testing method according to the present embodiment, as illustrated in FIG. 4 and FIG. 5, a non-light-emitting region having a width of 30 pixels is set between adjacent light-emitting regions. Accordingly, when the pixels in each light-emitting region are caused to emit light, the light-emitting regions are less influenced by the heat from other light-emitting regions. Therefore, when the lifetime characteristics are tested using the light-emitting regions described above, the test can be accurately performed.

The pixels in the light-emitting regions illustrated in FIG. 4 and FIG. 5 are caused to emit light at different luminance levels depending on their regions. In the testing method according to the present embodiment, as an example, the luminance levels of the pixels in the first light-emitting region 110, the second light-emitting region 120, the third light-emitting region 130, and the fourth light-emitting region 140 are respectively set to 450 [cd/m$^2$], 200 [cd/m$^2$], 100 [cd/m$^2$] and 68 [cd/m$^2$].

Next, a method for setting a non-light-emitting region will be described with reference to FIG. 6. The non-light-emitting region is a region between the light-emitting regions and which includes pixels which are not caused to emit light.

Figure 6:
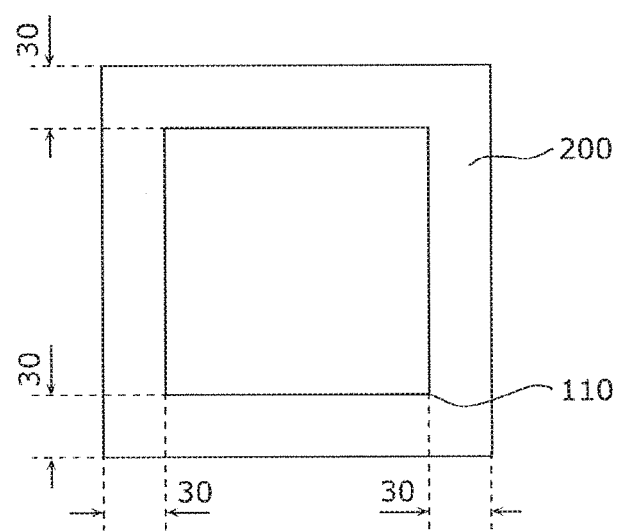
FIG. 6 is an enlarged view of a first light-emitting region and a non-light-emitting region in the display panel.

FIG. 6 is an enlarged view of the first light-emitting region 110 and a non-light-emitting region 200 in the display panel 4.

A method for setting the non-light-emitting region 200 that is set in the case where the pixels in the first light-emitting region 110 in FIG. 6 are caused to emit light at a luminance level of 450 [cd/m$^2$].

First, at least, a region including all pixels adjacent to the first light-emitting region 110 is set to the non-light-emitting region 200. Then, the value of the temperature rise of each of the pixels in proximity to the first light-emitting region 110 is measured when the pixels in the first light-emitting region 110 are placed in a light-emitting state where the pixels are caused to emit light at a luminance level of 450 [cd/m$^2$] from a non-light-emitting state. A region which includes all the pixels each having a temperature rise value greater than or equal to a predetermined value is set to the non-light-emitting region 200. Although the critical value of the temperature rise value is not particularly limited, for example, the critical value may be set to 5° C. In the testing method according to the present embodiment, a region having a width equal to 30 pixels from the first light-emitting region 110 is set as the non-light-emitting region 200.

The light-emitting region 200 may also be set around light-emitting regions other than the first light-emitting region 110 in a similar manner to the first light-emitting region 110. It may be that the non-light-emitting region 200 is set around the first light-emitting region 110 which are caused to emit light at a highest luminance level, and a non-light-emitting region having a width equal to the number of pixels in the non-light-emitting region 200 set around the first light-emitting region 110 may be set around another light-emitting region. This is due to the following reason. The influence of the heat of the first light-emitting region 110 which emits light at a highest luminance level on the surrounding pixels is greater than the influence of the heat of another light-emitting region on the surrounding pixels. Hence, by setting, to another light-emitting region, a non-light-emitting region having a width equal to the number of pixels identical to that of the non-light-emitting region around the first light-emitting region, the influence of the heat on adjacent light-emitting regions can be reliably reduced. Moreover, for example, in the case where only the first light-emitting region 110 which emits light at a high luminance level and the second light-emitting region 120 which emits light at a low luminance level are used, it may be that the above described non-light-emitting region 200 is set to the first light-emitting region 110 and the second light-emitting region 120 including a plurality of pixels which are not included from the first light-emitting region and the non-light-emitting region 200. In this way, the influence of the heat between the light-emitting regions can be reliably reduced.

1-3-2. Details of Test

Next, details of specific processing performed when the lifetime characteristics of the display panel 4 are tested by causing the pixels in the light-emitting regions set as described above to emit light will be described.

First, pixels in each light-emitting region set to the display panel 4 are caused to emit light at different luminance levels depending on their regions. Here, the luminance level of each pixel can be measured by the camera 20 illustrated in FIG. 1.

Then, while the pixels in each light-emitting region are continuously caused to emit light, at least the luminance level of each pixel is measured. In this way, the deterioration speed of the luminance level is obtained. Moreover, for example, the value of a drive current supplied to each pixel may be measured. In this way, characteristics such as temporal change of light conversion efficiency of each pixel can be obtained.

1-3-3. Procedure of Testing Method

The procedure of the testing method according to the present embodiment described above will be described with reference to FIG. 7.

FIG. 7 is a flow chart of a procedure of the testing method according to the present embodiment.

In the testing method according to the present embodiment, first, the same level of power (or drive current) is supplied to all the pixels in the display panel 4 to cause the entire display panel 4 to emit light. Then, the luminance level of each pixel is measured to determine the uniform region 40 as illustrated in FIG. 4 (S1). Next, the first light-emitting region 110 including a plurality of pixels is set within the determined uniform region 40 (S2). Then, while the first light-emitting region 110 emits light under a control of the display panel control circuit 12, the temperature around the first light-emitting region 110 is measured by the thermographic device 50 (S3). Using the result of the measurement, the non-light-emitting region 200 including all the pixels adjacent to the first light-emitting region 110 is set as described above (S4). Then, the second light-emitting region 120 including a plurality of pixels which are not included in the first light-emitting region 110 and the non-light-emitting region 200 is set (S5). Here, while the pixels in the first light-emitting region 110 and the pixels in the second light-emitting region 120 emit light at different luminance levels under a control of the display panel control circuit 12, the luminance level of each pixel is measured by the camera 20 (S6). Here, the drive current value, chromaticity and the like of each pixel may be measured in combination. Next, the lifetime characteristics are obtained based on the measured luminance value and the like of each pixel (S7).

The lifetime characteristics of the display panel 4 can be accurately obtained according to the above procedure.

The procedure in which the first light-emitting region 110 and the second light-emitting region 120 are used has been described above. In addition to the first light-emitting region 110 and the second light-emitting region 120, other light-emitting regions may be further added. For example, when the third light-emitting region 130 is to be set, the non-light-emitting region 200 is also set around the second light-emitting region 120 in a similar manner to the first light-emitting region 110, and the third light-emitting region 130 including a plurality of pixels which are not included in the second light-emitting region 120 and the non-light-emitting region 200 is set. Furthermore, the same applies to the case where the fourth light-emitting region 140 is set.

1-4. Advantageous Effects Etc.

As described above, the method for testing the display panel 4 according to the present embodiment includes: setting the first light-emitting region 110 including a plurality of pixels; setting a non-light-emitting region 200 including all the pixels adjacent to the first light-emitting region 110; setting the second light-emitting region 120 including a plurality of pixels which are not included in the first light-emitting region 110 and the non-light-emitting region 200; and testing the lifetime characteristics of the display panel 4 by causing the pixels in the first light-emitting region 110 and the pixels in the non-light-emitting region 200 to emit light at different luminance levels without causing the pixels in the non-light-emitting region 200 to emit light.

With this, the influence of the heat generated from the first light-emitting region 110 on the second light-emitting region 120 are reduced, allowing the lifetime characteristics to be accurately tested in each light-emitting region.

In the method for testing the display panel 4 according to the present embodiment, it may be that in the setting of the first light-emitting region 110, the uniform region 40 including pixels each having a luminance level within a predetermined range is determined by supplying the same level of power to all the pixels in the display panel 4 to cause the pixels to emit light and measuring the luminance level of each pixel, that the first light-emitting region 110 is set to be within the uniform region 40, and that in the setting of the second light-emitting region 120, the second light-emitting region 120 is set to be within the uniform region 40.

Accordingly, the characteristics of the pixels included in each light-emitting region can be equalized, leading to a reduction in variations in lifetime characteristics of the pixels in the light-emitting regions.

Moreover, in the method for testing the display panel 4 according to the present embodiment, it may be that in the setting of the non-light-emitting region 200, the value of the temperature rise of each pixel in proximity to the first light-emitting region 110 is measured when the pixels in the first light-emitting region 110 are placed in a light-emitting state from a non-light-emitting state, and that all of the pixels having a temperature rise value greater than or equal to a predetermined value is included in the non-light-emitting region 200.

Accordingly, the influence of the heat generated from the first light-emitting region 110 on the second light-emitting region 120 can be more reliably reduced. This leads to an accurate test of the lifetime characteristics in each light-emitting region.

Moreover, in the method for testing the display panel 4 according to the present embodiment, in the testing, it may be that the pixels in the first light-emitting region 110 may be caused to emit light at a brightness level greater than the brightness level of the pixels in the second light-emitting region 120.

Accordingly, the amount of heat generated from the first light-emitting region 110 is greater than the amount of heat generated from the second light-emitting region 120. Since a reduction in influence of the heat generated from the first light-emitting region 110 on the second light-emitting region 120 also reduces the influence of the heat generated from the second light-emitting region 120 on the first light-emitting region 110, the lifetime characteristics in each light-emitting region can be accurately tested.

Embodiment 2

2-1. Procedure of Manufacturing Method

Next, as Embodiment 2, a manufacturing method in which the testing method according to Embodiment 1 above is adopted in the manufacturing of the display panel 4 will be described with reference to FIG. 8.

FIG. 8 is a flowchart of a procedure of a method for manufacturing the display panel 4 according to the present embodiment.

As FIG. 8 illustrates, in the method for manufacturing the display panel 4 according to the present embodiment, first, in the manufacturing, the display panel 4 is manufactured based on predetermined parameters related to the manufacturing (S21). Here, the parameters related to the manufacturing refer to parameters related to manufacturing of, for example, organic EL elements or circuits included in the pixels of the display panel 4. For example, the parameters include material composition of the organic EL elements and film forming conditions in forming of circuits including, for example, thin-film transistors.

Next, in the testing, part of a plurality of display panels 4 manufactured in the manufacturing is extracted as samples and the lifetime characteristics of the extracted display panels 4 are tested using the testing method described in Embodiment 1 (S22).

Here, in the testing, if predetermined lifetime characteristics are obtained, the parameters are determined to be appropriate, and the manufacturing of the display panels 4 ends (Yes in S23). On the other hand, in the testing, if the predetermined lifetime characteristics are not obtained, the parameters are determined to be inappropriate, and the process proceeds to adjusting in which the parameters are adjusted (No in S23).

In the adjusting, parameters related to the manufacturing of the display panel 4 are adjusted based on the lifetime characteristics obtained in the testing (S24). For example, the parameters to be adjusted are estimated from the lifetime characteristics, and are appropriately adjusted.

In the adjusting, after the parameters are adjusted, the process returns to the manufacturing, and the display panels 4 are manufactured, and the lifetime characteristics of the manufactured display panels 4 are tested in the testing. Subsequently, the adjusting, the manufacturing, and the testing are repeated until the predetermined lifetime characteristics are obtained.

With such a manufacturing method, the display panel 4 including predetermined lifetime characteristics can be manufactured.

2-2. Advantageous Effects Etc.

As described above, the method for manufacturing the display panel 4 according to the present embodiment includes: manufacturing the display panel 4; testing, through the testing method according to Embodiment 1, the lifetime characteristics of the display panel 4 manufactured in the manufacturing; and adjusting parameters related to the manufacturing of the display panel 4 used in the manufacturing, when predetermined lifetime characteristics are not obtained in the testing. The adjusting, the manufacturing, and the testing are repeated until the predetermined lifetime characteristics are obtained in the testing.

Accordingly, the lifetime characteristics of the manufactured display panel 4 are accurately tested through the testing method according to Embodiment 1. Since the parameters related to the manufacturing of the display panel 4 are adjusted until the display panel 4 including the predetermined lifetime characteristics are obtained, the display panel 4 including the predetermined lifetime characteristics can be reliably obtained.

Other Embodiments

Although the testing method according to Embodiment 1 and the manufacturing method according to Embodiment 2 have been described above, the testing method and the manufacturing method according to the present disclosure are not limited to the above embodiments. Modifications obtainable through various changes to the above-described embodiments that can be conceived by a person of ordinary skill in the art without departing from the essence of the present invention, and the display panel manufactured using the manufacturing method according to Embodiment 2 are included in the present invention.

For example, in Embodiment 1 above, the thermographic device 50 is used as an example of the temperature measuring unit; however, the temperature measuring unit is not limited to the example, but may be any other units which can measure the temperature of each pixel in the display panel 4. It is to be noted that use of the thermographic device 50 as the temperature measuring unit allows the temperature of a wide range in the display panel 4 to be measured at once without a contact to the display panel 4. Moreover, a contact-type temperature measurer such as a thermocouple may be used as the temperature measuring unit. Use of the thermocouple allows inexpensive temperature measurement to be performed.

Moreover, as an object to be tested in the testing method according to Embodiment 1, the display panel 4 has been indicated which uses light-emitting elements including the organic EL elements; however, the object to be tested may be a display panel including light-emitting elements other than the organic EL elements. Other examples of the object to be tested include a display panel in which the lifetime characteristics of the pixels may be influenced by the heat from the surrounding pixels.

Figure 11:
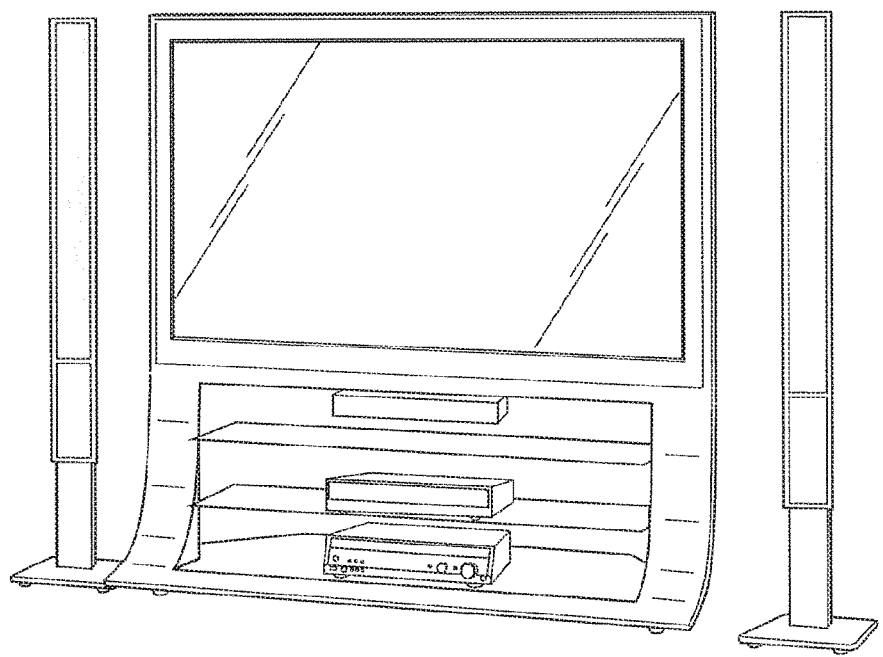
FIG. 11 is an external view of a thin flat-screen television (TV) manufactured by the manufacturing method according to Embodiment 2.

Moreover, for example, the manufacturing method according to Embodiment 2 is applied to a thin flat-screen TV as illustrated in FIG. 11. Use of the manufacturing method according to Embodiment 2 achieves a thin flat-screen TV with a display panel including predetermined lifetime characteristics.

INDUSTRIAL APPLICABILITY

The testing method and the manufacturing method of the display panel according to the present disclosure can be used, for example, in a testing method and a manufacturing method of an organic EL display panel.

The invention claimed is:
1. A method for testing lifetime characteristics of a display panel in which a plurality of pixels each including a light-emitting element are arranged in a matrix and configured to be grouped in different regions, the method comprising:
setting a first light-emitting region including a first set of pixels among the plurality of pixels, each pixel of the first set of pixels including a light-emitting element configured to emit light when driven;
setting a second light-emitting region including a second set of pixels among the plurality of pixels, each pixel of the second set of pixels including a light-emitting element configured to emit light when driven;
setting a non-light-emitting region including a third set of pixels among the plurality of pixels surrounding the first light-emitting region, such that the non-light-emitting region includes all pixels that are adjacent to the first light-emitting region among the plurality of pixels, each pixel of the third set of pixels including a light-emitting element configured to be in a non-light-emitting state; and
testing the lifetime characteristics of the display panel by causing the first set of pixels in the first light-emitting region and the second set of pixels in the second light-emitting region to emit light at different luminance levels while the third set of pixels in the non-light-emitting region are in the non-light-emitting state,
wherein the non-light-emitting region includes light-emitting elements that are configured to be in the non-light emitting state when the first light-emitting region and the second light-emitting region are in light-emitting states;
wherein, in the setting of the non-light-emitting region, includes measuring a value of a temperature increase of each pixel among the plurality of pixels located in proximity to the first light-emitting region when the first set of pixels in the first light-emitting region are driven to be placed in a light-emitting state from a non-light-emitting state, and
determining to include pixels each having an increase in temperature greater than or equal to a predetermined value in the non-light-emitting region;
wherein, in the testing, the first set of pixels in the first light-emitting region are caused to emit light at a luminance level greater than a luminance level of the second set of pixels in the second light-emitting region;
wherein the first light-emitting region is at least 30 pixels apart from the second light-emitting region; and
wherein an edge of the non-light-emitting region is at least 30 pixels apart from an edge of the first light-emitting region.
2. The method for testing lifetime characteristics of a display panel according to claim 1,
wherein, in the setting of the first light-emitting region includes,
determining a uniform region by supplying a same level of power to all of the plurality of pixels in the display panel to cause the plurality of pixels to emit light and measuring a luminance level of each of the plurality of pixels, and
setting the first light-emitting region to be within the uniform region, the uniform region including pixels each having a luminance level within a predetermined range among the plurality of pixels, and
in the setting of the second light-emitting region, the second light-emitting region is set to be within the uniform region.
3. A method for manufacturing a display panel in which a plurality of pixels each including a light-emitting element are arranged in a matrix and configured to be grouped in different regions, the method comprising:
manufacturing the display panel;
testing lifetime characteristics of the display panel manufactured in the manufacturing, through the testing method according to claim 1; and adjusting a parameter used in the manufacturing when predetermined lifetime characteristics of the display panel are not obtained in the testing, the parameter being related to manufacturing of the display panel, wherein in the adjusting, the manufacturing and the testing are repeated until the predetermined lifetime characteristics are obtained in the testing.

4. The method for testing lifetime characteristics of a display panel according to claim 1, wherein the setting of the non-light-emitting region is based on temperature of the first light-emitting region measured during emission of light.

* * * * *